United States Patent
Kamizono et al.

(10) Patent No.: US 8,822,034 B2
(45) Date of Patent: Sep. 2, 2014

(54) FILM-FORMING COMPOSITION, DIFFUSING AGENT COMPOSITION, METHOD FOR MANUFACTURING FILM-FORMING COMPOSITION, AND METHOD FOR MANUFACTURING DIFFUSING AGENT COMPOSITION

(71) Applicant: Tokyo Ohka Kogyo Co., Ltd., Kawasaki (JP)

(72) Inventors: Takashi Kamizono, Kawasaki (JP); Toshiro Morita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/864,517

(22) Filed: Apr. 17, 2013

(65) Prior Publication Data

US 2013/0281592 A1    Oct. 24, 2013

(30) Foreign Application Priority Data

Apr. 24, 2012  (JP) ................................ 2012-098988

(51) Int. Cl.
- *C08L 83/02* (2006.01)
- *C09D 11/00* (2014.01)
- *H05K 3/10* (2006.01)
- *H05K 1/09* (2006.01)

(52) U.S. Cl.
CPC *C09D 11/38* (2013.01); *H05K 3/10* (2013.01); *H05K 1/09* (2013.01)
USPC ............................ 428/447; 106/311; 524/588

(58) Field of Classification Search
None
See application file for complete search history.

(56) References Cited

U.S. PATENT DOCUMENTS

| | | | | |
|---|---|---|---|---|
| 7,931,940 B2 * | 4/2011 | Suzuki et al. | ................. | 427/344 |
| 8,586,144 B2 * | 11/2013 | Suzuki et al. | ................. | 427/344 |
| 2004/0039094 A1 * | 2/2004 | Taylor | ............................ | 524/261 |
| 2005/0118429 A1 * | 6/2005 | Taylor | ............................ | 428/412 |
| 2011/0017291 A1 * | 1/2011 | Morita et al. | ................. | 136/256 |
| 2011/0079262 A1 * | 4/2011 | Kamizono et al. | ............ | 136/243 |

FOREIGN PATENT DOCUMENTS

| JP | A-2003-168810 | 6/2003 |
|---|---|---|
| JP | A-2003-332606 | 11/2003 |
| JP | A-2006-156646 | 6/2006 |

* cited by examiner

*Primary Examiner* — Robert S Loewe
(74) *Attorney, Agent, or Firm* — Knobbe Martens Olson & Bear LLP

(57) ABSTRACT

A film-forming composition according to one embodiment includes a siloxane polymer (A) containing a condensation product (A1) and a condensation product (A2). In the (A), a contained amount of the (A1) is 75 percent or less by mass in terms of $SiO_2$ with respect to the total of the (A1) and the (A2). The (A) has a weight-average molecular weight (MW) of 80 percent or greater of a molecular weight value M determined by expression (1) if $R_{A1} > R_{A2}$, expression (2) if $R_{A1} < R_{A2}$, or expression (3) if $R_{A1} = R_{A2}$:

$$M = (R_{A1}/R_{A2})*(M_{A1}+M_{A2})+[(R_{A2}-R_{A1})/R_{A2})]M_{A2} \quad \text{expression (1):}$$

$$M = (R_{A1}/R_{A2})*(M_{A1}+M_{A2})+[(R_{A2}-R_{A1})/R_{A2})]M_{A2} \quad \text{expression (2):}$$

$$M = M_{A1}+M_{A2} \quad \text{expression (3):}$$

($M_{A1}$ and $R_{A1}$ are MW and the $SiO_2$-converted-mass ratio in the (A), respectively, for the (A1). $M_{A2}$ and $R_{A2}$ are MW and the $SiO_2$-converted-mass ratio in the (A), respectively, for the (A2)).

10 Claims, 1 Drawing Sheet

FILM-FORMING COMPOSITION, DIFFUSING AGENT COMPOSITION, METHOD FOR MANUFACTURING FILM-FORMING COMPOSITION, AND METHOD FOR MANUFACTURING DIFFUSING AGENT COMPOSITION

BACKGROUND OF THE INVENTION

1. Field of the Invention

The present invention relates to a film-forming composition, a method for manufacturing the film-forming composition, a diffusing agent composition, and a method for manufacturing the diffusing agent composition.

2. Description of the Related Art

According to the related art, for example, in manufacturing a solar cell, an N-type impurity diffusion layer is formed in a semiconductor substrate by applying a diffusing agent that contains an N-type impurity-diffusing component to a surface of the semiconductor substrate so as to form a film of the diffusing agent and then by causing the N-type impurity-diffusing component to diffuse from this film. Conventionally, as a method for forming a film of a diffusing agent on the surface of a semiconductor substrate, a spin coating method has often been employed where a coating liquid containing the diffusing agent is applied by a spin coater or the like.

However, in recent years, there is a need for cost reduction, high throughput, and reduction in environmental burden in semiconductor manufacturing related fields, particularly, solar cell manufacturing fields. More specifically, there is a need for reducing a used amount of a coating liquid for diffusion and partially forming regions with different diffusion carriers and diffusion concentrations, i.e., achieving partial diffusion, in a single substrate with a fewer number of steps. In this case, there has been a problem, in a conventional spin coating method, where the amount of a coating liquid used for each substrate is large, increasing the cost as well as the amount of a waste liquid. In partial diffusion, since it is necessary to form a diffusion protection film or the like in advance on a substrate by using a photolithography method or the like, there has also been a problem where the number of steps increases.

On the other hand, there has been suggested a method for partial diffusion by partially applying a diffusing agent on the surface of a semiconductor substrate by using an ink-jet method (see, for example, patent document Nos. 1-3). In an ink-jet method, a diffusing agent is selectively discharged from an ink-jet nozzle to an impurity diffusion layer forming region for patterning without using a mask. Thus, as compared with conventional spin coating methods, the ink-jet method does not require a complicated step and makes it possible to form a pattern easily while reducing the amount of liquid to be used.

CITATION LIST

Patent Literatures

[Patent Document No. 1] Japanese Patent Application Publication No. 2003-168810

[Patent Document No. 2] Japanese Patent Application Publication No. 2003-332606

[Patent Document No. 3] Japanese Patent Application Publication No. 2006-156646

In a conventional film-forming composition containing a diffusing agent composition, the viscosity of the composition often increases due to a change with the passage of time and the like at the time of storage. If the viscosity of the composition increases, there is a possibility that the composition changes to have a thick coating film in the case of a spin coating method, and there is a possibility that the stability of a discharge of the diffusing agent composition from a head of an ink-jet nozzle is lowered and that the measurements of a printed pattern are changed in the case of an ink-jet printing method. A change in the thickness of the coating film and the measurements of the pattern can lead to a change in the measurements of an impurity diffusion layer formed in a substrate, and a reduction in the stability of a discharge from the head can lead to a reduction in the accuracy of pattern formation.

Such a change in the measurements of the impurity diffusion layer and a reduction in the accuracy of pattern formation can affect the properties of a device to be manufactured such as a solar cell and the like. Meanwhile, there is a need to further improve the accuracy of the properties of a device in recent years. Therefore, there is a demand to improve changes, which are formerly acceptable, in the viscosity of a film-forming composition. In other words, there is a demand to further improve storage stability for a film-forming composition.

SUMMARY OF THE INVENTION

In this background, a purpose of the present invention is to provide a technology for improving the storage stability of a film-forming composition.

One embodiment of the present invention relates to a film-forming composition. The film-forming composition includes: a siloxane polymer (A) containing a condensation product (A1) made from a starting material, which is an alkoxysilane containing a tetra-functional alkoxysilane represented by the following formula (1), and a condensation product (A2) made from a starting material, which is an alkoxysilane represented by the following formula (2); and an organic solvent (B), wherein, in the siloxane polymer (A), a contained amount of the condensation product (A1) is 75 percent or less by mass in terms of $SiO_2$ with respect to the total of the condensation product (A1) and the condensation product (A2), and, when the weight-average molecular weight and the $SiO_2$-converted-mass ratio in the siloxane polymer (A) are respectively set to be $M_{A1}$ and $R_{A1}$ for the condensation product (A1) and the weight-average molecular weight and the $SiO_2$-converted-mass ratio in the siloxane polymer (A) are respectively set to be $M_{A2}$ and $R_{A2}$ for the condensation product (A2), the siloxane polymer (A) has a weight-average molecular weight $M_A$ of 80 percent or greater of a molecular weight value M determined by the following expression (1) if $R_{A1} > R_{A2}$, the following expression (2) if $R_{A1} < R_{A2}$, or the following expression (3) if $R_{A1} = R_{A2}$. Formula (1) is $Si(OR^1)_4$, where $R^1$ is an organic group and where each of a plurality of $R^1$s may be the same or different from each other. Formula (2) is $R^2{}_n Si(OR^3)_{4-n}$, where $R^2$ and $R^3$ are organic groups, where n is an integer of 1 or 2, and where, when there are a plurality of $R^2$s, the plurality of $R^2$s may be the same as or different from one another and, when there are a plurality of $(OR^3)$s, the plurality of $(OR^3)$s may be the same as or different from one another. Expression (1) is $M=(R_{A2}/R_{A1})*(M_{A1}+M_{A2})+[(R_{A1}-R_{A2})/R_{A1}]M_{A1}$, expression (2) is $M=(R_{A1}/R_{A2})*(M_{A1}+M_{A2})+[(R_{A2}-R_{A1})/R_{A2}]M_{A2}$, and expression (3) is $M=M_{A1}+M_{A2}$.

Another embodiment of the present invention relates to a diffusing agent composition. The diffusing agent composition is used to diffuse an impurity-diffusing component onto a semiconductor substrate and includes: the film-forming composition according to the above-described embodiment; and an impurity diffusion component (C).

Yet another embodiment of the present invention relates to a method for manufacturing a film-forming composition. The method for manufacturing a film-forming composition, includes: preparing a mixture of an organic solvent (B) and a siloxane polymer (A) containing a condensation product (A1) made from a starting material, which is an alkoxysilane containing a tetra-functional alkoxysilane represented by the following formula (1), and a condensation product (A2) made from a starting material, which is an alkoxysilane represented by the following formula (2), in which a contained amount of the condensation product (A1) is 75 percent or less by mass in terms of $SiO_2$ with respect to the total of the condensation product (A1) and the condensation product (A2); and increasing, when the weight-average molecular weight and the $SiO_2$-converted-mass ratio in the siloxane polymer (A) are respectively set to be $M_{A1}$ and $R_{A1}$ for the condensation product (A1) and the weight-average molecular weight and the $SiO_2$-converted-mass ratio in the siloxane polymer (A) are respectively set to be $M_{A2}$ and $R_{A2}$ for the condensation product (A2), the molecular weight of the siloxane polymer (A) in the mixture such that the weight-average molecular weight of the siloxane polymer (A) becomes 80 percent or greater of a molecular weight value M determined by the following expression (1) if $R_{A1} > R_{A2}$, the following expression (2) if $R_{A1} < R_{A2}$, or the following expression (3) if $R_{A1} = R_{A2}$.

Yet another embodiment of the present invention relates to a method for manufacturing a diffusing agent composition. The method for manufacturing a diffusing agent composition, includes adding an impurity-diffusing component (C) to a film-forming composition manufactured by the method for manufacturing a film-forming composition according to the above-described embodiment.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1A:
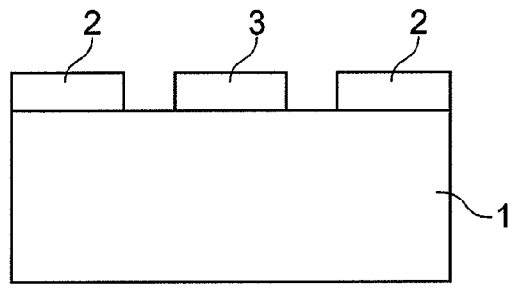
FIG. 1A through FIG. 1E are process sectional views for explaining a method for manufacturing a solar cell including a method for forming an impurity diffusion layer according to an embodiment.

The invention will now be described by reference to the preferred embodiments. This does not intend to limit the scope of the present invention, but to exemplify the invention.

Described below is an explanation with reference to figures, based on the preferred embodiments of the present invention. Like reference characters designate like or corresponding elements, members and processes throughout the views. The description of them will not be repeated for brevity. Reference herein to details of the illustrated embodiments is not intended to limit the scope of the claims. It should be understood that not all of the features and the combination thereof discussed are essential to the invention.

A film-forming composition according to the embodiment comprises a siloxane polymer (A) and an organic solvent (B). Hereinafter, each of the components contained in the film-forming composition will be described in detail.

<Siloxane Polymer (A)>

The siloxane polymer (A) contains a condensation product (A1) and a condensation product (A2).

<Condensation Product (A1)>

The condensation product (A1) is a reaction product made from a starting material, which is an alkoxysilane containing a tetra-functional alkoxysilane represented by the following formula (1), and obtained by the hydrolysis and then dehydration synthesis of the alkoxysilane.

$$Si(OR^1)_4 \qquad \text{Formula (1):}$$

[wherein $R^1$ is an organic group, each of a plurality of $R^1$s may be the same or different from each other.]

A silane compound (i) represented by the above formula (1) (i.e., tetra-functional alkoxysilane) can be further represented by the following chemical formula (1a).

$$Si(OR^{11})_a(OR^{12})_b(OR^{13})_c(OR^{14})_d \qquad \text{Formula (1a):}$$

(where $R^{11}$, $R^{12}$, $R^{13}$, and $R^{14}$ are each synonymous with the above $R^1$, and where a, b, c, and d are integers satisfying $0 \leq a \leq 4$, $0 \leq b \leq 4$, $0 \leq c \leq 4$, and $0 \leq d \leq 4$, and $a+b+c+d=4$.)

Specific examples of such a silane compound (i) include tetraalkoxysilanes such as tetramethoxysilane, tetraethoxysilane, tetrapropoxysilane, tetrabutoxysilane, tetrapentyloxysilane, tetraphenyloxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonoethoxymonobutoxysilane, dipropoxymonoethoxymonobutoxysilane, dibutoxymonomethoxymonoethoxysilane, dibutoxymonoethoxymonopropoxysilane, and monomethoxymonoethoxymonopropoxymonobutoxysilane, etc. Among them, tetramethoxysilane and tetraethoxysilane are preferred.

For the condensation product (A1), only a tetra-functional alkoxysilane represented by the above formula (1) may be used as a starting material thereof; alternatively, the tetra-functional alkoxysilane and another alkoxysilane may be used as starting materials thereof. A preferred example of said another alkoxysilane used as a starting material for the condensation product (A1) includes a silane compound (II) (tri-functional alkoxysilane) described later. When the tetra-functional alkoxysilane and another alkoxysilane are used as starting materials, a contained amount of the tetra-functional alkoxysilane in the condensation product (A1) is preferably 20 to 100 percent by mass in terms of $SiO_2$.

<Condensation Product (A2)>

The condensation product (A2) is a reaction product made from a starting material, which is an alkoxysilane represented by the following formula (2), and obtained by the hydrolysis and then dehydration synthesis of the alkoxysilane.

$$R^2_nSi(OR^3)_{4-n} \qquad \text{Formula (2):}$$

(where $R^2$ and $R^3$ are organic groups, where n is an integer of 1 or 2, and where, when there are a plurality of $R^2$s, the plurality of $R^2$s may be the same as or different from one another and, when there are a plurality of $(OR^3)$s, the plurality of $(OR^3)$s may be the same as or different from one another.)

The silane compound (II), occurring when n is 1 in the formula (2), can be further represented by the following chemical formula (2a).

$$R^{21}Si(OR^{31}))_e(OR^{32})_f(OR^{33})_g \qquad \text{Formula (2a):}$$

(where $R^{21}$ is synonymous with the above $R^2$, where $R^{31}$, $R^{32}$, and $R^{33}$ are each synonymous with the above $R^3$, and where e, f, and g are integers satisfying $0 \le e \le 3$, $0 \le f \le 3$, and $0 \le g \le 3$, and e+f+g=3.)

Specific examples of such a silane compound (II) include methyltrimethoxysilane, methyltriethoxysilane, methyltripropoxysilane, methyltripentyloxysilane, ethyltrimethoxysilane, ethyltripropoxysilane, ethyltripentyloxysilane, ethyltriphenyloxysilane, propyltrimethoxysilane, propyltriethoxysilane, propyltripentyloxysilane, propyltriphenyloxysilane, butyltrimethoxysilane, butyltriethoxysilane, butyltripropoxysilane, butyltripentyloxysilane, butyltriphenyloxysilane, methylmonomethoxydiethoxysilane, ethylmonomethoxydiethoxysilane, propylmonomethoxydiethoxysilane, butylmonomethoxydiethoxysilane, methylmonomethoxydipropoxysilane, methylmonomethoxydipentyloxysilane, methylmonomethoxydiphenyloxysilane, ethylmonomethoxydipropoxysilane, ethylmonomethoxydipentyloxysilane, ethylmonomethoxydiphenyloxysilane, propylmonomethoxydipropoxysilane, propylmonomethoxydipentyloxysilane, propylmonomethoxydiphenyloxysilane, butylmonomethoxydipropoxysilane, butylmonomethoxydipentyloxysilane, butylmonomethoxydiphenyloxysilane, methylmethoxyethoxypropoxysilane, propylmethoxyethoxypropoxysilane, butylmethoxyethoxypropoxysilane, methylmonomethoxymonoethoxymonobutoxysilane, ethylmonomethoxymonoethoxymonobutoxysilane, propylmonomethoxymonoethoxymonobutoxysilane, butylmonomethoxymonoethoxymonobutoxysilane, etc. Among them, methyltrialkoxysilane (in particular, methyltrimetoxysilane, methyltriethoxysilane) is preferred.

The silane compound (II), occurring when n is 2 in the formula (2), can be represented by the following formula (2b).

$$R^{22}R^{23}Si(OR^{34})_h(OR^{35})_i \qquad \text{Formula (2b):}$$

(where $R^{22}$ and $R^{23}$ are each synonymous with the above $R^2$, where $R^{34}$ and $R^{35}$ are each synonymous with the above $R^3$, and where h and i are integers satisfying $0 \le h \le 2$, $0 \le i \le 2$, and h+i=2.)

Specific examples of the alkoxysilane (iii) include dimethyldimethoxysilane, dimethylmethoxyethoxysilane, dimethyldiethoxysilane, dimethyldipentyloxysilane, dimethyldiphenyloxysilane, dimethylethoxypropoxysilane, dimethyldipropoxysilane, diethyldimethoxysilane, diethylmethoxypropoxysilane, diethyldiethoxysilane, diethylethoxypropoxysilane, dipropyldimethoxysilane, dipropyldiethoxysilane, dipropyldipentyloxysilane, dipropyldiphenyloxysilane, dibutyldimethoxysilane, dibutyldiethoxysilane, dibutyldipropoxysilane, dibutylmethoxypentyloxysilane, dibutylmethoxyphenyloxysilane, methylethyldimethoxysilane, methylethyldiethoxysilane, methylethyldipropoxysilane, methylethyldipentyloxysilane, methylethyldiphenyloxysilane, methylpropyldimethoxysilane, methylpropyldiethoxysilane, methylbutyldimethoxysilane, methylbutyldiethoxysilane, methylbutyldipropoxysilane, methylethoxypropoxysilane, ethylpropyldimethoxysilane, ethylpropylmethoxyethoxysilane, dipropyldimethoxysilane, dipropylmethoxyethoxysilane, propylbutyldimethoxysilane, propylbutyldiethoxysilane, dibutylmethoxyethoxysilane, dibutylmethoxypropoxysilane, dibutylethoxypropoxysilane, etc. Among them, dimethyldimethoxysilane and dimethyldiethoxysilane are preferred.

The condensation product (A1) can be prepared by a method of hydrolyzing one or more silane compounds (i) and, as necessary, one or more other alkoxysilanes in the presence of an acid catalyst, water, and an organic solvent. The condensation product (A2) can be prepared by a method of hydrolyzing one or more silane compounds (II) and/or one or more silane compounds (iii) in the presence of an acid catalyst, water, and an organic solvent.

An organic acid or an inorganic acid can be used as the acid catalyst. Examples of the inorganic acid that can be used include sulfuric acid, phosphoric acid, nitric acid, hydrochloric acid, etc. Among them, phosphoric acid and nitric acid are preferred. Examples of the organic acid that can be used include: carboxylic acid such as formic acid, oxalic acid, fumaric acid, maleic acid, glacial acetic acid, acetic anhydride, propionic acid, or n-butyric acid; and an organic acid having a sulfur-containing acid residue. An example of the organic acid having a sulfur-containing acid residue includes an organic sulfonic acid, and examples of the esterificated compounds thereof include an organic sulfate ester, an organic sulfite ester, etc. Of these examples, an organic sulfonic acid, for example, a compound represented by the following formula (α) is particularly preferred:

$$R^4—X \qquad \text{Formula (α):}$$

(wherein $R^4$ is a hydrocarbon group that may have a substituent, and where X is a sulfonic acid group.)

In the above formula (α), the hydrocarbon group serving as $R^4$ is preferably a hydrocarbon group having 1 to 20 carbon atoms. This hydrocarbon group may be a saturated or unsaturated group and may be any one of linear, branched and cyclic groups. When the hydrocarbon group of $R^4$ is circular, the group is preferably an aromatic hydrocarbon group such as a phenyl group, a naphthyl group, and an anthryl group. Among them, a phenyl group is particularly preferred. One or more hydrocarbon groups having 1 to 20 carbon atoms may be bonded to the aromatic ring in the aromatic hydrocarbon group as substituent groups. The hydrocarbon groups serving as the substituents on the aromatic ring may be saturated or unsaturated groups and may be any one of linear, branched and cyclic groups. The hydrocarbon group serving as $R^4$ may have one or more substituent groups. Examples of the substituent groups include, for example, a halogen atom such as a fluorine atom, and a sulfonic acid group, a carboxyl group, a hydroxyl group, an amino group, a cyano group, and the like.

The acid catalyst acts as a catalyst when the alkoxysilane is hydrolyzed in the presence of water. The amount of the acid catalyst that is used is preferably prepared such that the concentration thereof in the hydrolysis reaction system is in a range of from 1 to 1000 ppm and, in particular, in a range of from 5 to 800 ppm. The hydrolysis rate of a condensation product changes in accordance with the amount of water that is added. Thus, the amount of water to be added is determined in accordance with the hydrolysis rate to be obtained.

Examples of the organic solvent in the hydrolysis reaction system include: monohydric alcohol such as methanol, ethanol, propanol, isopropanol, and n-butanol; alkyl carboxylic esters such as methyl 3-methoxypropionate, and ethyl-3-ethoxypropionate; polyhydric alcohol such as ethylene glycol, diethylene glycol, propylene glycol, glycerin, trimethylolpropane, and hexanetriol; monoethers or monoacetates of a polyhydric alcohol, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether and propylene glycol monobutyl ether; esters such as methyl acetate, ethyl acetate, and butyl acetate; ketones such as acetone, methyl ethyl ketone, and methyl isoamyl ketone; and polyhydric alcohol ethers in which all hydroxyl groups in polyhydric alcohol are alkyl-etherized, such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, and diethylene glycol methyl ethyl ether. These organic solvents may be used alone or in combination of two or more of the organic solvents.

In such a reaction system, the alkoxysilane is hydrolyzed to yield the condensation product (A1) and the condensation product (A2). The hydrolysis reaction is usually completed in a period of about 5 to 100 hours. In order to shorten the reaction period, it is preferred to heat the system in a temperature range of 80 degrees Celsius or less.

After the completion of the reaction, a reaction solution is yielded, which contains the synthesized condensation product (A1) and the organic solvent used for the reaction or which contains the synthesized condensation product (A2) and the organic solvent used for the reaction. After separation from the respective organic solvents by a conventionally-known method, the condensation product (A1) and the condensation product (A2) can be obtained in a dry solid state or in a solution state where the respective solvents are substituted with other solvent as necessary.

The condensation product (A2) thus obtained contains a constitutional unit represented by the following formula (3):

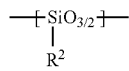

(3)

(where $R^2$ is an organic group, and where, when there are a plurality of constitutional units, the plurality of $R^2$s may be the same as or different from one another.)

The condensation product (A2) preferably contains a structure represented by the following formula (4):

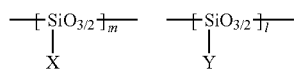

(4)

(where X is an alkoxy group, Y is an organic group, and the ratio of m:l ranges from 95:5 to 0:100, where Y may be an alkyl, aryl or epoxy group, or a group represented by $—R^5—R^6$, where a plurality of Xs or Ys may be the same or different from one another, where $R^6$ is an aryl group or a group containing an ethylenically unsaturated double bond, and where $R^5$ is an alkylene group having 1 to 9 carbon atoms. The formula may have different $R^5$s.)

In the condensation product (A2), the alkoxy group serving as X is preferably an alkoxy group having 1 to 10 carbon atoms and is more preferably an alkoxy group having 1 to 5 carbon atoms. Preferred examples of the alkoxy group serving as X include a methoxy group, an ethoxy group, an n-propoxy group, an iso-propoxy group, an n-butoxy group, and a tert-butoxy group, and a more preferred example thereof is a methoxy group.

In the condensation product (A2), the alkyl group serving as Y may be an alkyl group having 1 to 10 carbon atoms, and examples thereof include: linear alkyl groups such as methyl, ethyl, propyl, butyl, pentyl, hexyl, heptyl, octyl, nonyl, and decyl groups; branched alkyl groups such as 1-methylethyl, 1-methylpropyl, 2-methylpropyl, 1-methylbutyl, 2-methylbutyl, 3-methylbuytl, 1-ethylbutyl, 2-ethylbutyl, 1-methylpentyl, 2-methylpentyl, 3-methylpentyl, and 4-methylpentyl groups; and cyclic alkyl groups such as cyclopentyl, cyclohexyl, adamanthyl, norbornyl, isobornyl, tricyclodecanyl groups, and the like. The alkyl group serving as Y is preferably an alkyl group having 1 to 5 carbon atoms, more preferably an alkyl group having 1 to 3 carbon atoms, and particularly preferably a methyl group.

In the condensation product (A2), examples of the aryl group serving as Y include phenyl, biphenyl, fluorenyl, naphthyl, anthryl, and phenanthryl groups. The aryl group is preferably a phenyl group. The aryl group serving as Y may have a substituent group such as alkyl, alkoxy or hydroxyl group. Examples of the alkyl group serving as the substituent group of the aryl group of Y are the same as the examples of the alkyl group serving as Y. Examples of the alkoxy group serving as the substituent group of the aryl group of Y are the same as the examples of the alkoxy group serving as X.

In the condensation product (A2), the epoxy group serving as Y is preferably an epoxy group having 3 to 10 carbon atoms and more preferably an epoxy group having 3 to 7 carbon atoms.

In the condensation product (A2), the alkylene group having 1 to 9 carbon atoms serving as $R^5$ may be a linear or branched alkylene group. This alkylene group is preferably a linear alkylene group having 1 to 7 carbon atoms, more preferably a linear alkylene group having 1 to 5 carbon atoms, and even more preferably a methylene, ethylene or n-propylene group.

In the condensation product (A2), the group having an ethylenically unsaturated double bond as $R^6$ is preferably a group having, at its terminal, an ethylenically unsaturated double bond and particularly preferably a group represented by the following formula (5) or (6):

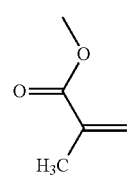

(5)

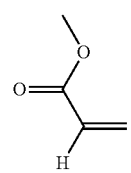

(6)

In the condensation product (A2), examples of the aryl group serving as $R^6$ are, for example, the same as the examples of the aryl group serving as Y.

In the condensation product (A2), Y is preferably an aryl group or a group represented by $—R^5—R^6$ since the condensation product (A2) is excellent in storage stability particularly in the solution.

In the siloxane polymer (A), a contained amount of the condensation product (A1) is 75 percent or less by mass in terms of $SiO_2$ with respect to the total of the condensation product (A1) and the condensation product (A2). The ratio of the $SiO_2$-converted mass (A1:A2) of the condensation product (A1) to that of the condensation product (A2) is preferably from 1:99 to 75:25 and more preferably 10:90 to 75:25. By setting the $SiO_2$-converted mass of the condensation product (A1) to be 75 percent by mass with respect to the total $SiO_2$-converted mass of the condensation product (A1) and the condensation product (A2), the storage stability of the film-forming composition can be improved.

By setting the $SiO_2$-converted mass of the condensation product (A1) to be 1 percent or greater by mass with respect to the total $SiO_2$-converted mass of the condensation product (A1) and the condensation product (A2), a Si content of the film-forming composition can be ensured. With this, the applicability of the film-forming composition can be more surely improved. Also, when the film-forming composition is used for a diffusing agent composition described later, the impurity diffusing ability of the diffusing agent composition can be more surely improved. When the film-forming composition is used for a composition for forming a diffusion protection mask used at the time of impurity diffusion to a semiconductor substrate, the diffusion protection ability can be more surely improved.

The "$SiO_2$-converted mass" is a value obtained by converting a contained amount of the entire Si in each of the condensation products into the mass of $SiO_2$. The "$SiO_2$-converted-mass ratio" is a ratio of the $SiO_2$ converted mass in the condensation product (A1) to the $SiO_2$ converted mass in the condensation product (A2).

When the weight-average molecular weight and the $SiO_2$-converted-mass ratio in the siloxane polymer (A) are respectively set to be $M_{A1}$ and $R_{A1}$ for the condensation product (A1) and the weight-average molecular weight and the $SiO_2$-converted-mass ratio in the siloxane polymer (A) are respectively set to be $M_{A2}$ and $R_{A2}$ for the condensation product (A2), the siloxane polymer (A) has a weight-average molecular weight value $M_A$ of 80 percent or greater of a molecular weight value M (hereinafter, the molecular weight value M is appropriately referred to as a target molecular weight value M) determined by the following expression (1) if $R_{A1} > R_{A2}$, the following expression (2) if $R_{A1} < R_{A2}$, or the following expression (3) if $R_A = R_{A2}$. The ratio of the weight-average molecular weight $M_A$ to the target molecular weight value M is appropriately referred to as a maturity rate in the following.

$$M = (R_{A2}/R_{A1}) * (M_{A1} + M_{A2}) + [(R_{A1} - R_{A2})/R_{A1}] M_{A1} \quad \text{Expression (1):}$$

$$M = (R_{A1}/R_{A2}) * (M_{A1} + M_{A2}) + [(R_{A2} - R_{A1})/R_{A2}] M_{A2} \quad \text{Expression (2):}$$

$$M = M_{A1} + M_{A2} \quad \text{Expression (3):}$$

As described, by determining the target molecular weight value M in accordance with any one of the expressions (1) through (3) selected based on a magnitude relationship between the $SiO_2$-converted-mass ratio of the condensation product (A1) and that of the condensation product (A2) and by setting the maturity rate of the siloxane polymer (A) to be 80 percent or greater, an increase in the viscosity of the film-forming composition due to a change with the passage of time and the like can be prevented.

That is, in general, in a film-forming composition, a hydrolysis reaction in an alkoxy group of an alkoxysilane constituting a condensation product and a following polycondensation reaction proceed by a sol-gel reaction, and the formation of a network of a siloxane bond proceeds. As a result, the molecular weight of the siloxane polymer (A) increases, thereby increasing the viscosity of the film-forming composition.

In contrast, in the film-forming composition according to the present embodiment, a hydrolysis reaction and a polycondensation reaction in an alkoxysilane in a condensation product are allowed to proceed in advance (hereinafter, this process is appropriately referred to as maturing), and the maturity rate of the siloxane polymer (A) is set to be 80 percent or greater. With this, molecular weight growth of the siloxane polymer (A) that can occur at the time of the storage of the film-forming composition or the like and an increase in the viscosity of the film-forming composition associated with the molecular weight growth can be prevented. Also, by this maturating process, a silane compound (i), which is relatively highly reactive, in the condensation product (A1) and silane compounds (II) and (iii), which are relatively less reactive, in the condensation product (A2) can be condensed. Therefore, reactive sites of the silane compound (i), which is relatively highly reactive, can be reduced, and the molecular weight growth of the siloxane polymer (A) and an increase in the viscosity of the film-forming composition can thus be prevented even more.

<Organic Solvent (B)>

The solvent component (B) is not particularly limited, and examples thereof include: alcohols such as methanol, ethanol, isopropanol, and butanol; ketones such as acetone, diethyl ketone, and methyl ethyl ketone; esters such as methyl acetate, ethyl acetate, and butyl acetate; polyhydric alcohols such as propylene glycol, glycerin, and dipropylene glycol; ethers such as dipropylene glycol dimethyl ether, ethylene glycol dimethyl ether, ethylene glycol diethyl ether, propylene glycol dimethyl ether, and propylene glycol diethyl ether; monoether-moiety-containing glycols such as ethylene glycol monomethyl ether, ethylene glycol monoethyl ether, propylene glycol monomethyl ether, propylene glycol monoethyl ether, and dipropylene glycol monomethyl ether; cyclic ethers such as tetrahydrofuran, and dioxane; ether-moiety-containing esters such as propylene glycol monomethyl ether acetate, and propylene glycol monoethyl ether acetate. These solvents may be used alone or in combination of two or more of the solvents. The contained amount of the organic solvent (B) is preferably 50 to 97 percent by mass and more preferably 75 to 97 percent by mass with respect to the entire mass of the film-forming composition.

The film-forming composition according to the present embodiment may further contain, as other components, a surfactant and an additive. When the film-forming composition contains a surfactant, the film-forming composition can be improved in applicability, flattenability, and developability, reducing the generation of unevenness in a film formed after the application. Although a conventionally-known surfactant can be used as such a surfactant component, a silicone-based surfactant is preferably used. The surfactant component is contained in an amount within a range of, for example, 100 to 10000 ppm (parts per million) by mass, preferably 300 to 5000 ppm by mass, and more preferably 500 to 3000 ppm by mass with respect to the entire film-forming composition. Even more preferably, a film-forming composition containing the surfactant of 2000 ppm by mass or less is used for a diffusing agent composition described later since a diffusing agent composition layer is excellent in detachability after diffusion treatment is performed. These surfactant components may be used alone or in combination of two or more of the surfactant components. The condensation product (A1) and the condensation product (A2) are distinguished from a silicone surfactant in an addition amount or advantageous effect thereof and are present as constituting components that are different from a silicone surfactant in the composition.

The additive may be added as necessary in order to adjust the properties such as viscosity and the like of the film-forming composition. The additive is, for example, polypropylene glycol.

A film-forming composition according to the present embodiment can be used as a material that constitutes a diffusing agent composition used to diffuse an impurity-diffusing component into a semiconductor substrate. In this case, the storage stability of the diffusing agent composition can be improved. Therefore, in particular, when a diffusing agent composition is selectively applied onto a semiconductor substrate by an ink-jet method, this diffusing agent composition can be suitably used. The semiconductor substrate can be used as a substrate for a solar cell. This diffusing agent composition contains the film-forming composition described above and an impurity-diffusing component (C).

<Impurity-Diffusing Component (C)>

The impurity-diffusing component (C) is a compound generally used as a dopant for manufacturing a solar cell. The impurity-diffusing component (C) is a P-type impurity-diffusing component containing a compound of a group III (the group 13) element or an N-type impurity-diffusing component containing a compound of a group V (the Group 15) element. In a process of forming an electrode in a solar cell, the P-type impurity-diffusing component can form a P-type impurity diffusion layer in an N-type semiconductor substrate and a $P^+$-type (high concentration P-type) impurity diffusion layer in a P-type semiconductor substrate. In a process of forming an electrode in a solar cell, the N-type impurity-diffusing component can form an N-type impurity diffusion layer (impurity diffusion region) in a P-type semiconductor substrate and an $N^+$-type (high concentration N-type) impurity diffusion layer in an N-type semiconductor substrate.

Examples of the compound of the Group III element include $B_2O_3$, borate esters such as trioctyl boron or the like, $Al_2O_5$, gallium trichloride, or the like, and the impurity-diffusing component (C) contains at least one kind of these compounds. Examples of the Group-V-element compound include $P_2O_5$, $Bi_2O_3$, $Sb(OCH_2CH_3)_3$, $SbCl_3$, $As(OC_4H_9)_3$, and phosphate esters including monomethyl phosphate, dimethyl phosphate, monoethyl phosphate, diethyl phosphate, triethyl phosphate, monopropyl phosphate, dipropyl phosphate, monobutyl phosphate, dibutyl phosphate, tributyl phosphate, and the like, and the impurity-diffusing component (C) contains at least one kind of these compounds.

The contained amount of the impurity-diffusing component (C) in the diffusing agent composition is appropriately adjusted in accordance with the layer thickness, etc., of an impurity diffusion layer formed on a semiconductor substrate. The ratio of the total $SiO_2$-converted mass of the siloxane polymer (A) to the impurity-atom-converted mass of the impurity-diffusing component (C) is preferably from 95:5 to 50:50 and more preferably from 85:15 to 60:40. A better diffusing performance can be obtained when the proportion of the impurity is more than the lower limit, and a possibility for generating a residue of the organic component in the diffusing agent after thermal diffusing treatment can be further lowered when the proportion is less than the upper limit.

In addition to the above-stated diffusing agent composition, a film-forming composition according to the present embodiment can be also used for a composition for forming a diffusion protection mask and a composition for forming an etching mask.

<Method for Manufacturing Film-Forming Composition>

A method for manufacturing a film-forming composition according to the present embodiment includes a process of preparing a mixture of a siloxane polymer (A) and an organic solvent (B) (hereinafter, this process is arbitrarily referred to as a mixture preparation process) and a process of increasing the molecular weight of the siloxane polymer (A) in the mixture (hereinafter, this process is arbitrarily referred to as a maturating process).

In the mixture preparation process, for example, a condensation product (A1) and an organic solvent (B) that have been prepared by the above-stated manufacturing method are mixed so as to prepare a condensation product solution (G1). Also, a condensation product (A2) and the organic solvent (B) that have been prepared by the above-stated manufacturing method are mixed so as to prepare a condensation product solution (G2). The condensation product solution (G1) and the condensation product solution (G2) are mixed such that a contained amount of the condensation product (A1) becomes 75 percent or less by mass in terms of $SiO_2$ with respect to the total of the condensation product (A1) and the condensation product (A2). In a liquid mixture, the condensation product (A1) and the condensation product (A2) are mixed so as to prepare a siloxane polymer (A). With this, a mixture of the siloxane polymer (A) and the organic solvent (B) can be obtained.

In the maturating process that follows, the molecular weight of the siloxane polymer (A) is increased so that a weight-average molecular weight $M_A$ of the siloxane polymer (A) becomes 80 percent or greater of a target molecular weight value M determined by any one of the above expressions (1) through (3) selected according to a $SiO_2$—converted-mass ratio. The molecular weight of the siloxane polymer (A) can be increased by, for example, heating the siloxane polymer (A) for 12 hours or longer at a temperature of 40° C. or higher. The heating of the siloxane polymer (A) can be performed by placing the siloxane polymer (A) for a predetermined period of time in a temperature retention compartment set at a predetermined temperature. Alternatively, the heating can be also performed by immersing the siloxane polymer (A) for a predetermined period of time in a water bath, an oil bath, or the like that is set at a predetermined temperature. During the heating of the siloxane polymer (A), the siloxane polymer (A) may be agitated using a stirrer chip, an agitation blade, or the like.

The weight-average molecular weight $M_A$ of the siloxane polymer (A) can be obtained by polystyrene conversion by gel permeation chromatography (GPC). More specifically, three pieces of TSK Gel Super manufactured by Tosoh Corporation are used as columns while setting the temperature of the columns to 40° C., and 40 μl of a test sample, which has been prepared by dissolving 0.02 grams of a powdered siloxane polymer (A) in 10 ml of THF (tetrahydrofuran), is injected at a flow rate of 0.6 ml/min so as to take a measurement in HLS-8220GPC manufactured by Tosoh Corporation. As a detector, a refractive index (RI) detector is used.

By the above processes, a film-forming composition can be manufactured. Also, by adding an impurity-diffusing component (C) to the film-forming composition manufactured by this method for manufacturing a film-forming composition, a diffusing agent composition can be manufactured.

<Method of Forming Impurity Diffusion Layer and Method of Manufacturing Solar Battery>

In reference to FIGS. 1A through 1E, an explanation is given regarding a method for forming an impurity diffusion layer and an example of a method for manufacturing a solar cell provided with a semiconductor substrate on which the impurity diffusion layer is formed by the aforementioned method. FIGS. 1A through 1E are process sectional views for explaining the method for manufacturing a solar cell including the method for forming the impurity diffusion layer according to the embodiment.

As shown in FIG. 1A, a diffusing agent composition 2 containing a P-type impurity-diffusing component (A) and a diffusing agent composition 3 containing an N-type impurity-diffusing component are selectively applied onto an N-type semiconductor substrate 1 such as a silicon substrate or the like. The diffusing agent composition 2 and the diffusing agent composition 3 are diffusing agent compositions that contain a film-forming composition according to the present embodiment. For example, the diffusing agent composition 2 and the diffusing agent composition 3 are patterned by selective application onto the surface of the semiconductor substrate 1 by an ink-jet method.

In other words, patterning is carried out by discharging the diffusing agent composition 2 from an ink-jet nozzle of a well-known ink-jet dispenser onto a forming region of a P-type impurity diffusion layer of the semiconductor substrate 1. Also, patterning is carried out by discharging the diffusing agent composition 3 from an ink-jet nozzle onto a forming region of the N-type impurity diffusion layer of the semiconductor substrate 1. After the patterning, the applied diffusing agent compositions 2 and 3 are dried using a well-known means such as an oven or the like. As an ink-jet discharging device, a piezoelectric discharging device can be used in which a piezo element (piezoelectric element) that deforms when a voltage is applied is used. Alternatively, a thermal-method discharging device that uses air bubbles generated by heating may be used.

Figure 1B:
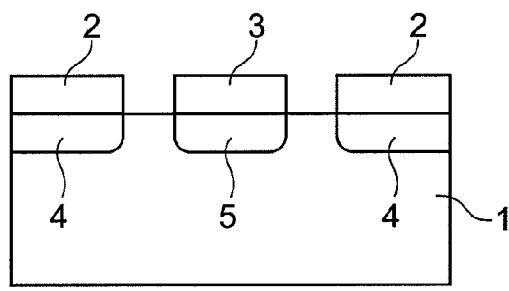

As shown in FIG. 1B, the semiconductor substrate 1 on which the diffusing agent compositions 2 and 3 are patterned is placed, for example, inside a diffusion furnace such as an electric furnace and is burned so that the P-type impurity-diffusing component (C) in the diffusing agent composition 2 and the N-type impurity-diffusing component (C) in the diffusing agent composition 3 diffuse into the semiconductor substrate 1 through the surface of the semiconductor substrate 1. Instead of a diffusion furnace, the semiconductor substrate 1 may be heated by radiation of a commonly-used laser. In this manner, the P-type impurity-diffusing component (C) diffuses into the semiconductor substrate 1, forming a P-type impurity diffusion layer 4, and the N-type impurity-diffusing component (C) diffuses into the semiconductor substrate 1, forming an N-type impurity diffusion layer 5.

Figure 1C:
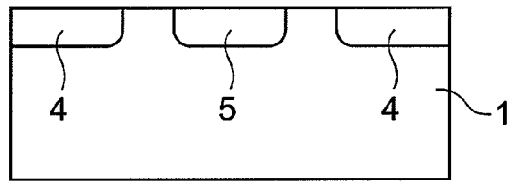

As shown in FIG. 1C, the diffusing agent compositions 2 and 3 are then removed by, for example, a release agent such as hydrofluoric acid or the like.

Figure 1D:
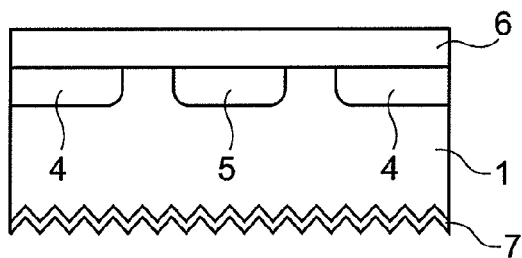

As shown in FIG. 1D, a passivation layer 6 is formed, by thermal oxidation or the like, on the surface of the semiconductor substrate 1 on the side where the P-type impurity diffusion layer 4 and the N-type impurity diffusion layer 5 are formed. Further, a texture structure having fine convex/concave structures is formed, by a well-known method, on the surface of the semiconductor substrate 1, the surface being opposite to the surface of the semiconductor substrate 1 where the passivation layer 6 has been formed, and a silicon nitride film 7 having an effect of preventing sunlight from being reflected is formed thereon.

Figure 1E:
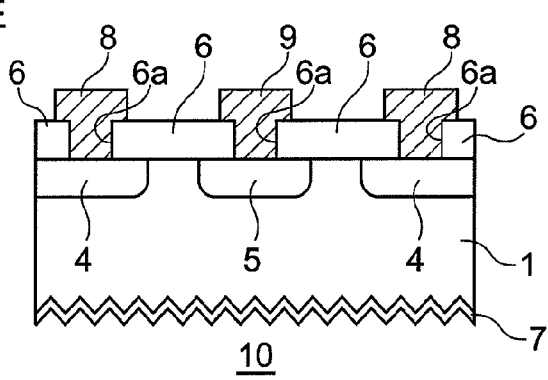

As shown in FIG. 1E, the passivation layer 6 is selectively removed by a well-known photolithography method and etching method so that contact holes 6a are formed in such a manner that predetermined regions of the P-type impurity diffusion layer 4 and N-type impurity diffusion layer 5 are exposed. Then, electrodes 8 electrically connected with the P-type impurity diffusion layer 4 are formed in the contact holes 6a, which are provided on the P-type impurity diffusion layer 4, by filling the contact holes 6a with a desired metal by, for example, an electrolytic plating method and an electroless plating method. Similarly, electrodes 9 electrically connected with the N-type impurity diffusion layer 5 are formed in the contact holes 6a provided on the N-type impurity diffusion layer 5. A solar battery 10 according to the present embodiment can be manufactured by the aforementioned processes.

The texture structure may be formed, for example, before the application of the diffusing agent compositions 2 and 3 onto the semiconductor substrate 1. The texture structure is formed on the lower surface of the semiconductor substrate 1 in this case. However, the texture structure or a convex/concave structure may be formed on the upper surface, in other words, the surface on which the passivation layer 6 is formed. The semiconductor substrate 1 may be a P-type substrate. For the application of the diffusing agent compositions 2 and 3 onto a surface of the semiconductor substrate 1, other methods may be used such as a spin coating method, a spray printing method, a roll coat printing method, a screen printing method, a letterpress printing method, an intaglio printing, or offset printing method.

As explained above, a film-forming composition according to the present embodiment comprises: a siloxane polymer (A) containing a condensation product (A1) made from a starting material, which is an alkoxysilane containing a tetra-functional alkoxysilane represented by the above formula (1), and a condensation product (A2) made from a starting material, which is an alkoxysilane represented by the above formula (2); and an organic solvent (B). In the siloxane polymer (A), a contained amount of the condensation product (A1) is 75 percent or less by mass in terms of $SiO_2$ with respect to the total of the condensation product (A1) and the condensation product (A2). When the weight-average molecular weight and the $SiO_2$-converted-mass ratio in the siloxane polymer (A) are respectively set to be $M_{A1}$ and $R_{A1}$ for the condensation product (A1) and the weight-average molecular weight and the $SiO_2$-converted-mass ratio in the siloxane polymer (A) are respectively set to be $M_{A2}$ and $R_{A2}$ for the condensation product (A2), the siloxane polymer (A) has a weight-average molecular weight $M_A$ of 80 percent or greater of a target molecular weight value M determined by the above expression (1) if $R_{A1} > R_{A2}$, the above expression (2) if $R_{A1} < R_{A2}$, or the above expression (3) if $R_{A1} = R_{A2}$.

With this, the storage stability of the film-forming composition can be improved, and an increase in the viscosity of the film-forming composition caused with the passage of time can thus be prevented. Therefore, a change in the thickness and the print pattern of the film-forming composition and a reduction in the discharge stability of the film-forming composition when an ink-jet method is employed as a method for applying the composition can be prevented. As a result, the accuracy of the device properties can be improved.

The invention is not limited to the above-mentioned embodiments, and various modifications, such as a design change, may be added thereto on the basis of knowledge of those skilled in the art. It should be understood that any embodiment to which one or more of the modifications are added is also included in the scope of the invention.

[Exemplary Embodiments]

The invention will now be described by reference to the preferred exemplary embodiments. This does not intend to limit the scope of the present invention, but to exemplify the invention.

<Storage Stability Test for Diffusing Agent Composition>

Respective components and contained amounts of diffusing agent compositions used in experiments are shown in Table 1. In exemplary embodiments 1-4 and comparative examples 1 to 5 shown in the following, tetraethoxysilane was used as a starting material for a condensation product (A1). As a condensation product (A2), X-40-9272B (manufactured by Shin-Etsu Chemical Co., Ltd.) having a structure represented by the following formula (7) was used.

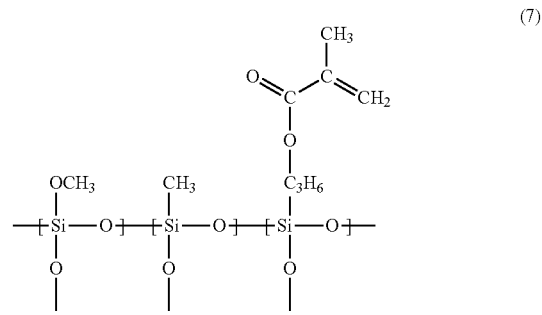

(7)

In the following exemplary embodiments 1-4 and comparative examples 1-5, SF8421EG (manufactured by Dow Corning Toray Co., Ltd.) was used as a surfactant. With regard to the contained amount of an organic solvent (B), an amount left after subtracting the respective contained amounts of the other components from 100 percent by weight, when the entire mass of each diffusing agent composition is set to be 100 percent by weight, represents the contained amount of the organic solvent (B).

mixed such that a condensation product solution (G2) was prepared in which the $SiO_2$-converted concentration of a condensation product (A2) is 78.9 percent by mass. The weight-average molecular weight $M_{A1}$ of the condensation product (A1) was 2500, and the weight-average molecular weight $M_{A2}$ of the condensation product (A2) was 1000.

In accordance with $SiO_2$-converted-mass ratios shown in Table 1, the condensation product solution (G1) and the condensation product solution (G2) were mixed. A maturating

TABLE 1

| | FILM-FORMING COMPOSITION | | | | | |
|---|---|---|---|---|---|---|
| | CONDENSATION COMPOUND (A1) | | CONDENSATION COMPOUND (A2) | | $SiO_2$-CONVERTED-MASS RATIO | |
| | WEIGHT-AVERAGE MOLECULAR WEIGHT | CONTAINED AMOUNT (IN TERMS OF $SiO_2$) | WEIGHT-AVERAGE MOLECULAR WEIGHT | CONTAINED AMOUNT (IN TERMS OF $SiO_2$) | | |
| | $M_{A1}$ | (wt %) | $M_{A2}$ | (wt %) | $R_{A1}$ | $R_{A2}$ |
| EXEMPLARY EMBODIMENT 1 | 2500 | 2.1 | 1000 | 8.3 | 20 | 80 |
| EXEMPLARY EMBODIMENT 2 | 2500 | 4.1 | 1000 | 6.2 | 40 | 60 |
| EXEMPLARY EMBODIMENT 3 | 2500 | 6.2 | 1000 | 4.1 | 60 | 40 |
| EXEMPLARY EMBODIMENT 4 | 2500 | 6.4 | 1000 | 3.9 | 62 | 38 |
| COMPARATIVE EXAMPLE 1 | 2500 | 8.3 | 1000 | 2.1 | 80 | 20 |
| COMPARATIVE EXAMPLE 2 | 2500 | 4.1 | 1000 | 6.2 | 40 | 60 |
| COMPARATIVE EXAMPLE 3 | 2500 | 6.2 | 1000 | 4.1 | 60 | 40 |
| COMPARATIVE EXAMPLE 4 | 2500 | 6.4 | 1000 | 3.9 | 62 | 38 |
| COMPARATIVE EXAMPLE 5 | 2500 | 8.3 | 1000 | 2.1 | 80 | 20 |

| | IMPURITY-DIFFUSING COMPONENT (C) | | | |
|---|---|---|---|---|
| | COMPONENT | CONTAINED AMOUNT (wt %) | SURFACTANT (ppm) | ORGANIC SOLVENT (B) |
| EXEMPLARY EMBODIMENT 1 | TEB | 13.0 | 500 | DPGM |
| EXEMPLARY EMBODIMENT 2 | TEB | 13.0 | 500 | DPGM |
| EXEMPLARY EMBODIMENT 3 | TEB | 13.0 | 500 | DPGM |
| EXEMPLARY EMBODIMENT 4 | TEB | 13.0 | 500 | DPGM |
| COMPARATIVE EXAMPLE 1 | TEB | 13.0 | 500 | DPGM |
| COMPARATIVE EXAMPLE 2 | TEB | 13.0 | 500 | DPGM |
| COMPARATIVE EXAMPLE 3 | TEB | 13.0 | 500 | DPGM |
| COMPARATIVE EXAMPLE 4 | TEB | 13.0 | 500 | DPGM |
| COMPARATIVE EXAMPLE 5 | TEB | 13.0 | 500 | DPGM |

In Table 1, DPGM represents dipropylene glycol monomethyl ether, and TEB represents triethyl boron.

<Preparation of Film-Forming Composition>

Ethanol, tetraethoxysilane, and concentrated hydrochloric acid were mixed to synthesize a condensation product (A1). Then, the solvent was replaced by DPGM such that a condensation product solution (G1) was prepared in which the $SiO_2$-converted concentration of the condensation product (A1) is 30.3 percent by mass. Then, X-40-9272B and DPGM were process of a siloxane polymer (A) was performed for mixed solutions according to respective exemplary embodiments and comparative examples. As requirements for the maturating process, the heating temperature was set to be 40° C., and the heating time was set to be 12 hours. Then, a target molecular weight value M was calculated, and the weight-average molecular weight $M_A$ of the siloxane polymer (A) after the maturating process was measured. Based on the weight-average molecular weight $M_A$ and the target molecular weight value M, a maturity rate (%) [$(M_A/M)*100$] was calculated. Target molecular weight values M, the weight-average molecular weights $M_A$ of a siloxane polymer (A) after the maturating process, and maturity rates (%) of the respective film-forming compositions used for the exemplary embodiments and comparative examples are shown in Table 2.

As shown in Table 2, it was confirmed that diffusing agent compositions of exemplary embodiments 1-4, in which respective $SiO_2$-converted-mass ratios of the condensation product (A1) were 75 percent or less with respect to the sum of the condensation product (A1) and the condensation product (A2), and respective maturity rates of a siloxane polymer

TABLE 2

|  | TARGET MOLECULAR WEIGHT VALUE M | WEIGHT-AVERAGE MOLECULAR WEIGHT $M_A$ | MATURITY RATE (%) | RATE OF INCREASE IN VISCOSITY (%) | | STORAGE STABILITY |
|---|---|---|---|---|---|---|
|  |  |  |  | INITIAL VALUE | 40° C., 12 D |  |
| EXEMPLARY EMBODIMENT 1 | 1630 | 1600 | 98 | 0 | 2 | A |
| EXEMPLARY EMBODIMENT 2 | 2640 | 2100 | 80 | 0 | 2 | A |
| EXEMPLARY EMBODIMENT 3 | 3140 | 3000 | 96 | 0 | 0 | AA |
| EXEMPLARY EMBODIMENT 4 | 3100 | 3000 | 96 | 0 | 0 | AA |
| COMPARATIVE EXAMPLE 1 | 2750 | 3200 | 116 | 0 | 5 | B |
| COMPARATIVE EXAMPLE 2 | 2640 | 1500 | 57 | 0 | 7 | B |
| COMPARATIVE EXAMPLE 3 | 3140 | 1700 | 54 | 0 | 6 | B |
| COMPARATIVE EXAMPLE 4 | 3100 | 2400 | 77 | 0 | 3 | B |
| COMPARATIVE EXAMPLE 5 | 2750 | 2200 | 80 | 0 | 5 | B |

<Preparation of Diffusing Agent Composition>

The SF8421EG agent was diluted with DPGM so as to prepare a 5% SF8421EG solution as a surfactant solution. Also, 31.2 grams of D-mannitol (0.171 mol) and 50.0 grams of TEB (0.342 mol) were mixed and then heated for 30 minutes at 70° C. so as to prepare a dopant solution. In accordance with the composition and ratio shown in Table 1, respective film-forming compositions, the 5% SF8421EG solution, the dopant solution, and DPGM were mixed so as to prepare respective diffusing agent compositions for the exemplary embodiments and the comparative examples.

<Measurement of Viscosity Change and Evaluation on Storage Stability for Diffusing Agent Composition>

Regarding the initial viscosity (cP) of the respective diffusing agent compositions of the exemplary embodiments and comparative examples, 15 ml of each of the compositions was sampled in a Cannon-Fenske viscosity tube in a thermostatic bath of 25° C. using a VMC-252 capillary viscometer (manufactured by Rigo Co., Ltd.), and the initial viscosity thereof was measured based on a speed (time) of the composition passing through the narrow tube under own weight. The diffusing agent compositions were then left under an environment of 40° C. for 12 days. Then, the viscosity of each of the diffusing agent compositions was measured again, and a rate of increase (%) in the viscosity after 12 days was calculated with respect to the initial viscosity. Based on a result of the calculation of the rate of increase in the viscosity, the storage stability of each diffusing agent composition was evaluated. As an evaluation method, "B" meaning poor was entered when the rate of increase in viscosity was three percent or greater, "A" meaning good was entered when the rate was less than three percent, and "AA" meaning excellent was entered when the rate was one percent or less. Evaluation results for a rate of increase in viscosity and for storage stability are shown in Table 2.

(A) were 80 percent or greater, had good storage stability. Also, it was confirmed that exemplary embodiments 3 and 4, in which respective $SiO_2$-converted-mass ratios of the condensation product (A1) were 60 percent or greater with respect to the sum of the condensation product (A1) and the condensation product (A2), had excellent storage stability.

<Storage Stability Test for Film-Forming Composition>

A film-forming composition of exemplary embodiment 5 was prepared by the same composition and manufacturing method used for the film-forming composition used in the diffusing agent composition of exemplary embodiment 4. A film-forming composition of comparative example 6 was prepared by the same composition and manufacturing method used for the film-forming composition used in the diffusing agent composition of comparative example 4. Then, the weight-average molecular weight $M_A$ of a siloxane polymer (A) after the maturating process in each of the respective film-forming compositions of exemplary embodiment 5 and comparative example 6 was measured, and the maturity rates (%) was calculated. Further, for each of the respective film-forming compositions of exemplary embodiment 5 and comparative example 6, initial viscosity and viscosity after the film-forming composition was left under an environment of 40° C. for 31 days were measured by the same viscosity measuring method as the viscosity measuring method described above, and a rate of increase in viscosity (%) was calculated. Then, based on a result of the calculation of the rate of increase in the viscosity, the storage stability of each diffusing agent composition was evaluated. The same evaluation method as the evaluation method described above was used. Evaluation results for target molecular weight values M, the weight-average molecular weights $M_A$ of a siloxane polymer (A) after the maturating process, maturity rates, rates of increase in viscosity, and storage stability are shown in Table 3.

TABLE 3

| | TARGET MOLECULAR WEIGHT | WEIGHT-AVERAGE MOLECULAR WEIGHT | MATURITY RATE (%) | RATE OF INCREASED IN VISCOSITY (%) | | STORAGE STABILITY |
| --- | --- | --- | --- | --- | --- | --- |
| | VALUE M | WEIGHT $M_A$ | | INITIAL VALUE | 40° C., 31 D | |
| EXEMPLARY EMBODIMENT 5 | 3100 | 3000 | 96 | 0 | 0 | AA |
| COMPARATIVE EXAMPLE 6 | 3100 | 1800 | 58 | 0 | 5 | B |

As shown in Table 3, it was confirmed that film-forming composition of exemplary embodiment 5, in which the $SiO_2$-converted-mass ratio of the condensation product (A1) was 75 percent or less with respect to the sum of the condensation product (A1) and the condensation product (A2), and the maturity rate of a siloxane polymer (A) was 80 percent or greater, had good storage stability.

For example, embodiments according to the following combinations can be also included in the scope of the present invention.

(Item 1)

A film-forming composition comprising:

a siloxane polymer (A) containing a condensation product (A1) made from a starting material, which is an alkoxysilane containing a tetra-functional alkoxysilane represented by the following formula (1), and a condensation product (A2) made from a starting material, which is an alkoxysilane represented by the following formula (2); and an organic solvent (B), wherein, in the siloxane polymer (A), a contained amount of the condensation product (A1) is 75 percent or less by mass in terms of $SiO_2$ with respect to the total of the condensation product (A1) and the condensation product (A2), and when the weight-average molecular weight and the $SiO_2$-converted-mass ratio in the siloxane polymer (A) are respectively set to be $M_{A1}$ and $R_{A1}$ for the condensation product (A1) and the weight-average molecular weight and the $SiO_2$-converted-mass ratio in the siloxane polymer (A) are respectively set to be $M_{A2}$ and $R_{A2}$ for the condensation product (A2), the siloxane polymer (A) has a weight-average molecular weight $M_A$ of 80 percent or greater of a molecular weight value M determined by the following expression (1) if $R_{A1} > R_{A2}$, the following expression (2) if $R_{A1} < R_{A2}$, or the following expression (3) if $R_{A1} = R_{A2}$, wherein formula (1) is $Si(OR^1)_4$, where $R^1$ is an organic group, each of a plurality of $R^1$s may be the same or different from each other), wherein formula (2) is $R^2{}_n Si(OR^3)_{4-n}$, where $R^2$ and $R^3$ are organic groups, where n is an integer of 1 or 2, and where, when there are a plurality of $R^2$s, the plurality of $R^2$s may be the same as or different from one another and, when there are a plurality of $(OR^3)$s, the plurality of $(OR^3)$s may be the same as or different from one another, wherein expression (1) is $M = (R_{A2}/R_{A1})*(M_{A1}+M_{A2}) + [(R_{A1}-R_{A2})/R_{A1}]M_{A1}$, wherein expression (2) is $M = (R_{A1}/R_{A2})*(M_{A1}+M_{A2}) + [(R_{A2}-R_{A1})/R_{A2}]M_{A2}$, and wherein expression (3) is $M = M_{A1}+M_{A2}$.

(Item 2)

The film-forming composition according to item 1, wherein the ratio of the $SiO_2$-converted mass (A1:A2) of the condensation product (A1) to that of the condensation product (A2) is from 1:99 to 75:25.

(Item 3)

The film-forming composition according to item 1 or item 2, wherein the condensation product (A2) contains a constitutional unit represented by the following formula (3):

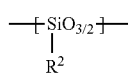

(3)

where $R^2$ is an organic group, and where, when there are a plurality of constitutional units, the plurality of $R^2$s may be the same as or different from one another.

(Item 4)

A diffusing agent composition used to diffuse an impurity-diffusing component onto a semiconductor substrate, comprising:

the film-forming composition according to any one of items 1 through 3; and an impurity diffusion component (C).

(Item 5)

The diffusing agent composition according to item 4, wherein the impurity-diffusing component (C) contains a compound of a group III element or a group V element.

(Item 6)

The diffusing agent composition according to item 4 or item 5, which is used for application by an ink-jet method.

(Item 7)

A method for manufacturing a film-forming composition, comprising:

preparing a mixture of an organic solvent (B) and a siloxane polymer (A) containing a condensation product (A1) made from a starting material, which is an alkoxysilane containing a tetra-functional alkoxysilane represented by the following formula (1), and a condensation product (A2) made from a starting material, which is an alkoxysilane represented by the following formula (2), in which a contained amount of the condensation product (A1) is 75 percent or less by mass in terms of $SiO_2$ with respect to the total of the condensation product (A1) and the condensation product (A2); and increasing, when the weight-average molecular weight and the $SiO_2$-converted-mass ratio in the siloxane polymer (A) are respectively set to be $M_{A1}$ and $R_{A1}$ for the condensation product (A1) and the weight-average molecular weight and the $SiO_2$-converted-mass ratio in the siloxane polymer (A) are respectively set to be $M_{A2}$ and $R_{A2}$ for the condensation product (A2), the molecular weight of the siloxane polymer (A) in the mixture such that the weight-average molecular weight of the siloxane polymer (A) becomes 80 percent or greater of a molecular weight value M determined by the following expression (1) if $R_{A1} > R_{A2}$, the following expression (2) if $R_{A1} < R_{A2}$, or the following expression (3) if $R_{A1} = R_{A2}$, wherein formula (1) is $Si(OR^1)_4$, where $R^1$ is an organic group, and where each of a plurality of $R^1$s may be the same or different from each other, wherein formula (2): $R^2{}_n Si(OR^3)_{4-n}$, where $R^2$ and $R^3$ are organic groups, where n is an integer of 1 or 2, and where, when there are a plurality of $R^2$s, the plurality of $R^2$s may be the same as or different from one another and, when there are a plurality of $(OR^3)$s, the plurality of $(OR^3)$s may be the same as or different from one another, wherein expression (1) is $M=(R_{A2}/R_{A1})*(M_{A1}+M_{A2})+[(R_{A1}-R_{A2})/R_{A1}]M_{A1}$, wherein expression (2) is $M=(R_{A1}/R_{A2})*(M_{A1}+M_{A2})+[(R_{A2}-R_{A1})/R_{A2}]M_{A2}$, and wherein expression (3): $M=M_{A1}+M_{A2}$.

(Item 8)

The method for manufacturing a film-forming composition according to item 7, wherein, in the increasing of the molecular weight of the siloxane polymer (A), the molecular weight of the siloxane polymer (A) is increased by heating the siloxane polymer (A) for 12 hours or longer at a temperature of 40° C. or higher.

(Item 9)

A method for manufacturing a diffusing agent composition, comprising a adding an impurity-diffusing component (C) to a film-forming composition manufactured by the method for manufacturing a film-forming composition according to item 7 or item 8.

What is claimed is:

1. A film-forming composition comprising:
a siloxane polymer (A) containing a condensation product (A1) made from a starting material, which is an alkoxysilane containing a tetra-functional alkoxysilane represented by the following formula (1), and a condensation product (A2) made from a starting material, which is an alkoxysilane represented by the following formula (2); and
an organic solvent (B),
wherein, in the siloxane polymer (A),
a contained amount of the condensation product (A1) is 75 percent or less by mass in terms of $SiO_2$ with respect to the total of the condensation product (A1) and the condensation product (A2), and
when the weight-average molecular weight and the $SiO_2$-converted-mass ratio in the siloxane polymer (A) are respectively set to be $M_{A1}$ and $R_{A1}$ for the condensation product (A1) and the weight-average molecular weight and the $SiO_2$-converted-mass ratio in the siloxane polymer (A) are respectively set to be $M_{A2}$ and $R_{A2}$ for the condensation product (A2), the siloxane polymer (A) has a weight-average molecular weight $M_A$ of 80 percent or greater of a molecular weight value M determined by the following expression (1) if $R_{A1} > R_{A2}$, the following expression (2) if $R_{A1} < R_{A2}$, or the following expression (3) if $R_{A1} = R_{A2}$,
wherein formula (1) is $Si(OR^1)_4$, where $R^1$ is an organic group and where each of a plurality of $R^1$s may be the same or different from each other,
wherein formula (2) is $R^2{}_n Si(OR^3)_{4-n}$, where $R^2$ and $R^3$ are organic groups, where n is an integer of 1 or 2, and where, when there are a plurality of $R^2$s, the plurality of $R^2$s may be the same as or different from one another and, when there are a plurality of $(OR^3)$s, the plurality of $(OR^3)$s may be the same as or different from one another,
wherein expression (1) is $M=(R_{A2}/R_{A1})*(M_{A1}+M_{A2})+[(R_{A1}-R_{A2})/R_{A1}]M_{A1}$,
wherein expression (2) is $M=(R_{A1}/R_{A2})*(M_{A1}+M_{A2})+[(R_{A2}-R_{A1})/R_{A2}]M_{A2}$, and
wherein expression (3) is $M=M_{A1}+M_{A2}$.

2. The film-forming composition according to claim 1, wherein the ratio of the $SiO_2$-converted mass (A1:A2) of the condensation product (A1) to that of the condensation product (A2) is from 1:99 to 75:25.

3. The film-forming composition according to claim 1, wherein the condensation product (A2) contains a constitutional unit represented by the following formula (3):

where $R^2$ is an organic group, and where, when there are a plurality of constitutional units, the plurality of $R^2$s may be the same as or different from one another.

4. A diffusing agent composition used to diffuse an impurity-diffusing component onto a semiconductor substrate, comprising:
a siloxane polymer (A) containing a condensation product (A1) made from a starting material, which is an alkoxysilane containing a tetra-functional alkoxysilane represented by the following formula (1), and a condensation product (A2) made from a starting material, which is an alkoxysilane represented by the following formula (2);
an organic solvent (B); and
an impurity diffusion component (C),
wherein, in the siloxane polymer (A),
a contained amount of the condensation product (A1) is 75 percent or less by mass in terms of $SiO_2$ with respect to the total of the condensation product (A1) and the condensation product (A2), and
when the weight-average molecular weight and the $SiO_2$-converted-mass ratio in the siloxane polymer (A) are respectively set to be $M_{A1}$ and $R_{A1}$ for the condensation product (A1) and the weight-average molecular weight and the $SiO_2$-converted-mass ratio in the siloxane polymer (A) are respectively set to be $M_{A2}$ and $R_{A2}$ for the condensation product (A2), the siloxane polymer (A) has a weight-average molecular weight $M_A$ of 80 percent or greater of a molecular weight value M determined by the following expression (1) if $R_{A1} > R_{A2}$, the following expression (2) if $R_{A1} < R_{A2}$, or the following expression (3) if $R_{A1} = R_{A2}$,
wherein formula (1) is $Si(OR)_4$, where $R^1$ is an organic group and where each of a plurality of $R^1$s may be the same or different from each other,
wherein formula (2) is $R^2{}_n Si(OR^3)_{4-n}$, where $R^2$ and $R^3$ are organic groups, where n is an integer of 1 or 2, and where, when there are a plurality of $R^2$s, the plurality of $R^2$s may be the same as or different from one another and, when there are a plurality of $(OR^3)$s, the plurality of $(OR^3)$s may be the same as or different from one another,
wherein expression (1) is $M=(R_{A2}/R_{A1})*(M_{A1}+M_{A2})+[(R_{A1}-R_{A2})/R_{A1}]M_{A1}$,
wherein expression (2) is $M=(R_{A1}/R_{A2})*(M_{A1}+M_{A2})+[(R_{A2}-R_{A1})/R_{A2}]M_{A2}$, and
wherein expression (3) is $M=M_{A1}+M_{A2}$.

5. The diffusing agent composition according to claim 4, wherein the ratio of the $SiO_2$-converted mass (A1:A2) of the condensation product (A1) to that of the condensation product (A2) is from 1:99 to 75:25.

6. The diffusing agent composition according to claim 4, wherein the condensation product (A2) contains a constitutional unit represented by the following formula (3):

where $R^2$ is an organic group, and where, when there are a plurality of constitutional units, the plurality of $R^2$s may be the same as or different from one another.

7. The diffusing agent composition according to claim 4, wherein the impurity-diffusing component (C) contains a compound of a group III element or a group V element.

8. The diffusing agent composition according to claim 4, which is used for application by an ink-jet method.

9. A method for manufacturing a film-forming composition, comprising:
preparing a mixture of an organic solvent (B) and a siloxane polymer (A) containing a condensation product (A1) made from a starting material, which is an alkoxysilane containing a tetra-functional alkoxysilane represented by the following formula (1), and a condensation product (A2) made from a starting material, which is an alkoxysilane represented by the following formula (2), in which a contained amount of the condensation product (A1) is 75 percent or less by mass in terms of $SiO_2$ with respect to the total of the condensation product (A1) and the condensation product (A2); and increasing, when the weight-average molecular weight and the $SiO_2$-converted-mass ratio in the siloxane polymer (A) are respectively set to be $M_{A1}$ and $R_{A1}$ for the condensation product (A1) and the weight-average molecular weight and the $SiO_2$-converted-mass ratio in the siloxane polymer (A) are respectively set to be $M_{A2}$ and $R_{A2}$ for the condensation product (A2), the molecular weight of the siloxane polymer (A) in the mixture such that the weight-average molecular weight of the siloxane polymer (A) becomes 80 percent or greater of a molecular weight value M determined by the following expression (1) if $R_{A1} > R_{A2}$, the following expression (2) if $R_{A1} < R_{A2}$, or the following expression (3) if $R_{A1} = R_{A2}$, wherein formula (1) is $Si(OR^1)_4$, where $R^1$ is an organic group and where each of a plurality of $R^1$s may be the same or different from each other, wherein formula (2) is $R^2{}_n Si(OR^3)_{4-n}$, where $R^2$ and $R^3$ are organic groups, where n is an integer of 1 or 2, and where, when there are a plurality of $R^2$s, the plurality of $R^2$s may be the same as or different from one another and, when there are a plurality of $(OR^3)$s, the plurality of $(OR^3)$s may be the same as or different from one another, wherein expression (1) is $M = (R_{A1}/R_{A2})*(M_{A1}+M_{A2}) + [(R_{A2}-R_{A1})/R_{A2}]M_{A2}$, wherein expression (2) is $M = (R_{A1}/R_{A2})*(M_{A1}+M_{A2}) + [(R_{A2}-R_{A1})/R_{A2}]M_{A2}$, and wherein expression (3) is $M = M_{A1}+M_{A2}$.

10. The method for manufacturing a film-forming composition according to claim 9, wherein, in the increasing of the molecular weight of the siloxane polymer (A), the molecular weight of the siloxane polymer (A) is increased by heating the siloxane polymer (A) for 12 hours or longer at a temperature of 40° C. or higher.

* * * * *